(12) United States Patent
Hiraoka et al.

(10) Patent No.: US 8,681,407 B2
(45) Date of Patent: Mar. 25, 2014

(54) OPTICAL REFLECTION ELEMENT

(75) Inventors: Soichiro Hiraoka, Hyogo (JP); Kazuki Komaki, Osaka (JP); Masaki Tada, Osaka (JP); Shigeo Furukawa, Osaka (JP); Kiyomi Furukawa, Osaka (JP); Shinsuke Nakazono, Osaka (JP); Yuta Yamamoto, Osaka (JP); Toshiaki Horie, Osaka (JP)

(73) Assignee: Panasonic Corporation, Osaka (JP)

( * ) Notice: Subject to any disclaimer, the term of this patent is extended or adjusted under 35 U.S.C. 154(b) by 15 days.

(21) Appl. No.: 13/581,837

(22) PCT Filed: Mar. 24, 2011

(86) PCT No.: PCT/JP2011/001722
§ 371 (c)(1),
(2), (4) Date: Aug. 30, 2012

(87) PCT Pub. No.: WO2011/121946
PCT Pub. Date: Oct. 6, 2011

(65) Prior Publication Data
US 2012/0320439 A1    Dec. 20, 2012

(30) Foreign Application Priority Data
Mar. 30, 2010  (JP) .................... 2010-078442

(51) Int. Cl.
*G02B 26/08* (2006.01)
(52) U.S. Cl.
USPC ........................................ 359/214

(58) Field of Classification Search
USPC ............ 359/212.1, 214.1, 223.1, 224.1, 555, 359/872–874, 876; 310/309
See application file for complete search history.

(56) References Cited

U.S. PATENT DOCUMENTS

| 6,934,439 B2 * | 8/2005 | Mala et al. ...................... 385/18 |
| 7,616,372 B2 * | 11/2009 | Miller et al. ................... 359/291 |
| 2008/0179988 A1 | 7/2008 | Jeong et al. |
| 2012/0113492 A1 | 5/2012 | Nakazono et al. |

FOREIGN PATENT DOCUMENTS

| JP | 2005-156684 | 6/2005 |
| JP | 2007-248731 | 9/2007 |
| JP | 2008-181127 | 8/2008 |
| JP | 2009-093120 | 4/2009 |
| JP | 2010-197662 | 9/2010 |
| WO | 2010/122751 | 10/2010 |

OTHER PUBLICATIONS

International Search Report of PCT Application No. PCT/JP2011/001722 dated May 17, 2011.

* cited by examiner

*Primary Examiner* — Tuyen Tra
(74) *Attorney, Agent, or Firm* — Panasonic Patent Center (57) ABSTRACT

An optical reflection element has a frame, a pair of meandering-shaped vibration elements, a mirror having a reflection surface, and a pair of protective beams. The vibration elements have their respective outer ends supported by confronting portions of an inside of the frame. The vibration elements support the mirror with respective inner ends thereof. The protective beams extend from the respective confronting portions of the inside of the frame toward the mirror with a predetermined space from the vibration elements and in parallel with a vibration axis of the vibration elements.

7 Claims, 7 Drawing Sheets

OPTICAL REFLECTION ELEMENT

TECHNICAL FIELD

The present invention relates to optical reflection elements used for image projection devices such as head-up displays, head-mounted displays and the like apparatuses.

BACKGROUND ART

Figure 8:
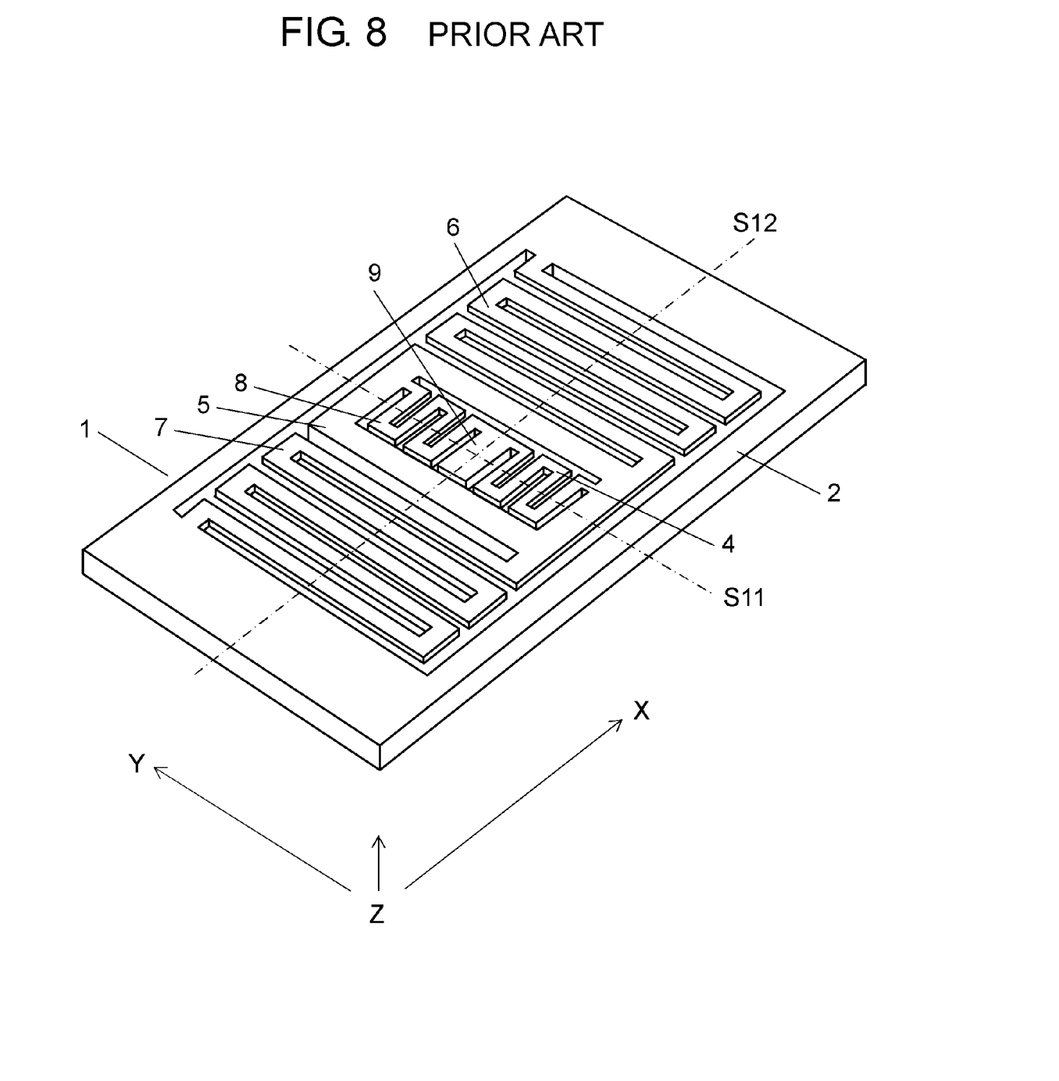
FIG. 8 is a perspective view of a conventional optical reflection element.

FIG. 8 is a perspective view of a conventional optical reflection element. Optical reflection element 1 has inner frame 5, a pair of meandering-shaped first vibration elements 4 and 8, outer frame 2, a pair of meandering-shaped second vibration elements 6 and 7, and mirror 9. Second vibration elements 6 and 7 have their outer ends supported by respectively confronting portions of an inside of outer frame 2. Second vibration elements 6 and 7 support inner frame 5 with their inner ends. First vibration elements 4 and 8 have their respective outer ends supported by confronting portions, which are orthogonal to vibration axis S12 of the first vibration elements, along an inside of inner frame 5. First vibration elements 4 and 8 have vibration axis S11. First vibration elements 4 and 8 support mirror 9 with their inner ends.

In optical reflection element 1, mirror 9 and inner frame 5 function as mass bodies. These mass bodies vibrate under the effects of torsional vibrations and oscillations of any of second vibration elements 6 and 7 and first vibration elements 4 and 8.

Optical reflection element 1 of such structure causes inner frame 5 and mirror 9 to swing with large amplitude when it resonates with turbulent vibrations or it receives impacts from the outside. First vibration elements 4 and 8 deform, and they even become damaged when the deformation exceeds their permissible level as a result of these vibrations. There are thus such cases that optical reflection element 1 become damaged when it receives turbulent vibrations or impacts from the outside.

There are a number of techniques that are aimed at suppressing amplitude of vibrations in at least one of directions of X-axis and Y-axis and/or a direction of Z-axis in order to reduce damages to optical reflection element 1, such as one disclosed in Patent Literature 1. To be specific, outer frame 2 and inner frame 5 are provided with asperities formed on them to suppress impacts in any of the directions of X-axis and Y-axis. A unitary structure provided with such impact suppression measures can be achieved easily by altering a mask design used for producing the optical reflection element. It is difficult, however, to take similar measures against the direction of Z-axis, and an additional impact suppressing member, or a protector for instance, is disposed to suppress the amplitude of vibrations in the direction of Z-axis.

Problems arise, however, when a protector is provided to suppress the amplitude of vibrations in the direction of Z-axis, such that it results in increase in number of components and the task of keeping accuracy of alignment during the assembling. In addition, the protector needs to be disposed in a location away from first vibration elements 4 and 8 and second vibration elements 6 and 7, since first vibration elements 4 and 8 and second vibration elements 6 and 7 vibrate in operation. It is this reason that makes downsizing difficult, and leaving the optical reflection element less resistible against large impacts.

CITATION LIST

Patent Literature
PTL 1: Unexamined Japanese Patent Publication No. 2010-197662.

SUMMARY OF THE INVENTION

The present invention discloses optical reflection elements provided with an improvement in resistance against impact in the direction of Z-axis. A first optical reflection element according to the present invention has a frame, a pair of meandering-shaped vibration elements, a mirror having a reflection surface, and a pair of protective beams. The vibration elements have their respective outer ends supported by confronting portions of an inside of the frame. The vibration elements support the mirror with their inner ends. The protective beams extend from the respective confronting portions of the inside of the frame toward the mirror with a predetermined space from the vibration elements and in parallel with a vibration axis of the vibration elements.

A second optical reflection element according to the present invention has a first frame, a pair of meandering-shaped first vibration elements, a mirror having a reflection surface, a second frame, a pair of meandering-shaped second vibration elements, and a pair of outer protective beams. The first vibration elements have their respective outer ends supported by first confronting portions of an inside of the first frame. The first vibration elements support the mirror with their inner ends. The first frame is disposed inside the second frame. The second vibration elements have their respective outer ends supported by second confronting portions of an inside of the second frame. The second vibration elements support the first frame with their inner ends. A vibration axis of the second vibration elements is orthogonal to a vibration axis of the first vibration elements. The outer protective beams extend from the respective second confronting portions of the inside of the second frame toward the first frame with a predetermined space from the second vibration elements and in parallel with the vibration axis of the second vibration elements.

It becomes possible with any of the above structures to improve the resistance against impact in the direction of Z-axis.

DETAILED DESCRIPTION OF THE INVENTION

Figure 1:
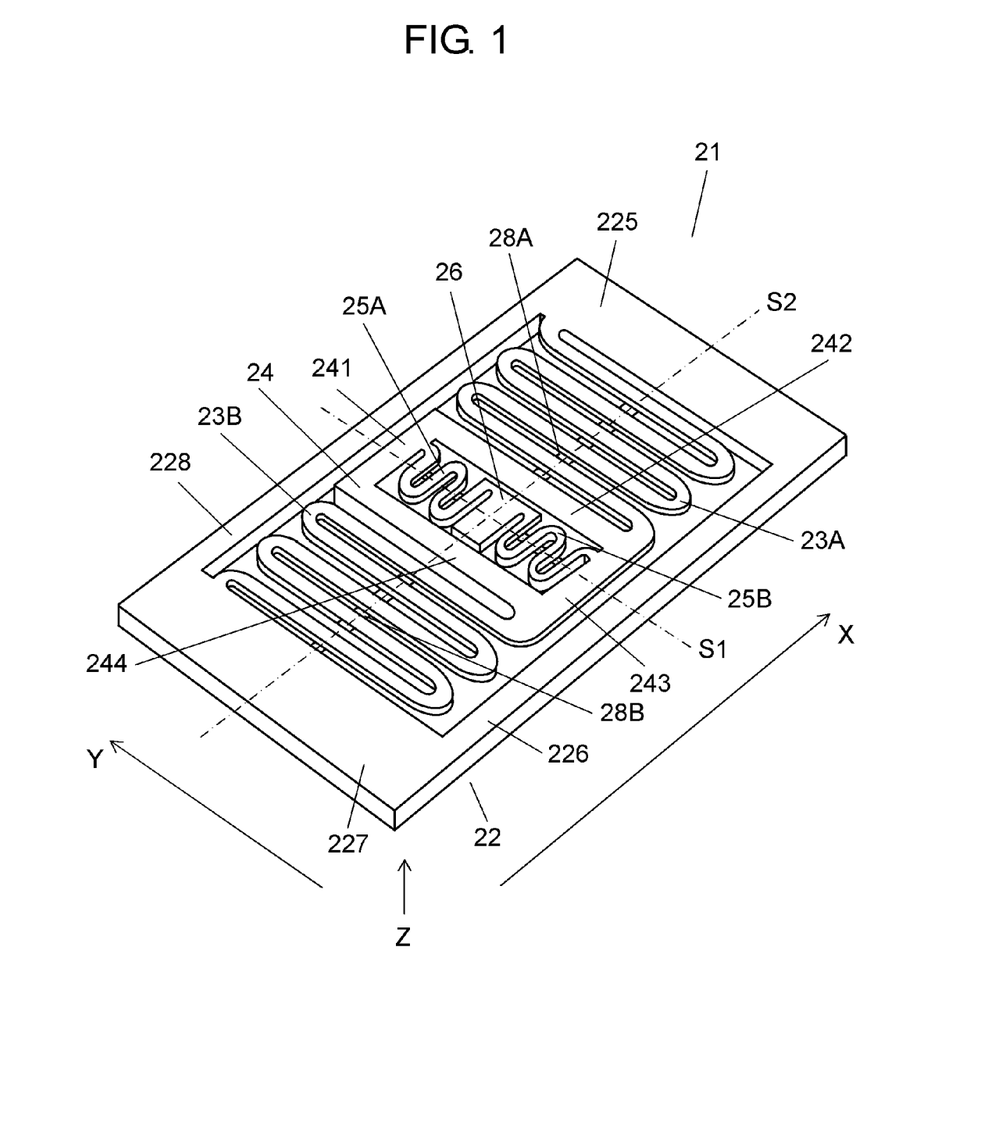
FIG. 1 is a top perspective view of an optical reflection element according to an exemplary embodiment of the present invention.
Figure 2:
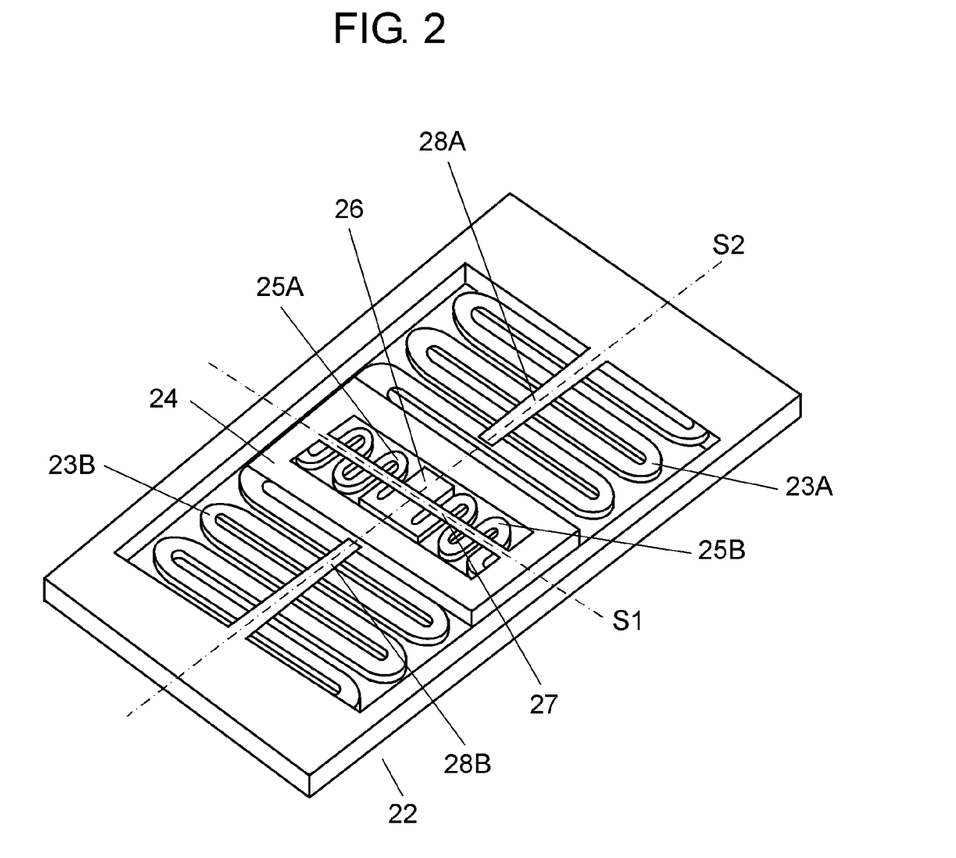
FIG. 2 is a bottom perspective view of the optical reflection element shown in FIG. 1.

FIG. 1 and FIG. 2 are top perspective view and bottom perspective view of an optical reflection element according to an exemplary embodiment of the present invention. Optical reflection element 21 has first frame 24, meandering-shaped first vibration elements 25A and 25B, mirror 26, second frame 22, meandering-shaped second vibration elements 23A and 23B, a pair of outer protective beams 28A and 28B, and inner protective beam 27.

First frame 24 and second frame 22 have quadrilateral shapes in the top view. First frame 24 has first side 241, second side 242 next to first side 241, third side 243 opposite to first side 241 and next to second side 242, and fourth side 244 opposite to second side 242.

Second frame 22 has fifth side 225, sixth side 226 next to fifth side 225, seventh side 227 opposite to fifth side 225 and next to sixth side 226, and eighth side 228 opposite to sixth side 226. First frame 24 is disposed inside second frame 22.

A plurality of straight portions of first vibration elements 25A and 25B are extended substantially in parallel to a direction of X-axis. First vibration elements 25A and 25B have vibration axis S1 that passes through generally the center of mirror 26 and substantially in parallel to Y-axis. These straight portions that intersect with vibration axis S1 are folded up and connected in coplanar to form the meandering shape. The vibration axis S1 passes substantially through the center of mirror 26, and first vibration elements 25A and 25B are in line symmetric with respect to vibration axis S2, which is orthogonal to vibration axis S1, or point symmetric with respect to the intersection between vibration axis S1 and vibration axis S2.

A plurality of straight portions of second vibration elements 23A and 23B are extended substantially in parallel to a direction of the Y-axis. Second vibration elements 23A and 23B have vibration axis S2 that passes through generally the center of first frame 24 and substantially in parallel to the X-axis. These straight portions that intersect with vibration axis S2 are folded up and connected in coplanar to form the meandering shape. The vibration axis S2 passes substantially through the center of first frame 24, and second vibration elements 23A and 23B are in line symmetric with respect to vibration axis S1, which is orthogonal to vibration axis S2, or point symmetric with respect to the intersection between vibration axis S1 and vibration axis S2. The vibration axis S1 and vibration axis S2 are in the relation that they intersect at right angles at substantially the center of mirror 26.

First vibration elements 25A and 25B and second vibration elements 23A and 23B can be easily deformed with elasticity since these vibration elements are formed into the meandering-shapes as described above. As a result, it is possible to efficiently gain large vibrating amplitudes and to contribute to downsizing of optical reflection element 21.

First vibration element 25A has its outer end supported by an inside of first side 241 of first frame 24, and first vibration element 25B has its outer end supported by an inside of third side 243 of first frame 24. In other words, first vibration elements 25A and 25B have their respective outer ends supported by first side 241 and third side 243 that are first confronting portions of the inside of first frame 24. Mirror 26 has a reflection surface, and is supported by respective inner ends of first vibration elements 25A and 25B.

Second vibration element 23A has an outer end supported by an inside of fifth side 225 of second frame 22, and an inner end of second vibration element 23A supports first frame 24. Second vibration element 23B has an outer end supported by an inside of seventh side 227 of second frame 22, and an inner end of second vibration element 23B supports first frame 24. In other words, second vibration elements 23A and 23B have their respective outer ends supported by fifth side 225 and seventh side 227, which are second confronting portions of the inside of second frame 22, and their inner ends support first frame 24. Vibration axis S2 of second vibration elements 23A and 23B is orthogonal to vibration axis S1 of first vibration elements 25A and 25B.

Second side 242 of first frame 24 confronts fifth side 225 of second frame 22 with second vibration element 23A interposed therebetween, and fourth side 244 of first frame 24 confronts seventh side 227 with second vibration element 23B interposed therebetween.

Description is provided next of inner protective beam 27. Inner protective beam 27 extends from first side 241 of first frame 24 to mirror 26, and further to third side 243 of first frame 24. In other words, inner protective beam 27 is substantially in parallel with vibration axis S1 of first vibration elements 25A and 25B, and faces first vibration elements 25A and 25B with a predetermined space (i.e., space in the direction of Z-axis). That is, inner protective beam 27 is formed in a manner to pass through the center part of mirror 26 from the insides of first frame 24 directly underneath vibration axis S1 of first vibration elements 25A and 25B with the predetermined space. Inner protective beam 27, first frame 24 and second frame 22 are formed flush with each other when viewed from the opposite side of reflection surface of mirror 26, as shown in FIG. 2.

Inner protective beam 27 is formed to have the both ends connected to first frame 24. First vibration elements 25A and 25B and mirror 26 are therefore elastically deformable without being restrained by inner protective beam 27. In addition, inner protective beam 27 has flexibility and excellent cushioning property because it is long in length. Thus provided is a high resistance against impact in the direction of Z-axis attributed to inner protective beam 27. In other words, an excessive displacement of first vibration elements 25A and 25B can be suppressed since a part of first vibration elements 25A and 25B comes to abut against inner protective beam 27 even if first frame 24 shifts in the direction of Z-axis due to extraneous vibrations and the like. It hence becomes possible to suppress vibrations of first vibration elements 25A and 25B beyond a certain level of amplitude in the direction of Z-axis, and improve the resistance to impact in the Z-axis.

Since inner protective beam 27 faces vibration axis S1, it can make mirror 26 vibrate in a repeatable turning motion of large amplitude about vibration axis S1 in the direction of Y-axis. By virtue of arranging inner protective beam 27 and first vibration elements 25A and 25B close to each other, it hence becomes possible to reduce the size and weight of optical reflection element 21, and improve the resistance to impact.

Inner protective beam 27 is formed under mirror 26. However, the shape of inner protective beam 27 needs not be limited to this configuration. It is also acceptable not to form inner protective beam 27 under mirror 26 so long as inner protective beams 27 are formed directly under vibration axis S1 of first vibration elements 25A and 25B, and extended from the insides of first frame 24 toward the center part of mirror 26 with a predetermined space.

However, there requires a complicated mask pattern when an etching method is used for this structure as will be described later, in which a pair of the inner protective beams are formed to extend from two confronting portions at the insides of first frame 24 toward the center part of mirror 26. It is therefore desirable in the light of manufacturing that inner protective beam 27 is formed opposite to reflection surface of mirror 26 in the manner to extend from one of the confronting portions at the inside of first frame 24 toward the other confronting portion at the opposite inside of first frame 24 through the center part of mirror 26. This means it is preferable that one pair of the inner protective beams are formed opposite to reflection surface of mirror 26, and they are joined to each other at a position confronting mirror 26.

Although inner protective beam 27 is provided only at one side of first vibration elements 25A and 25B, this structure is sufficient to deal with impacts in the direction of Z-axis for practical applications. Nevertheless, another cover or the like member may be attached to the opposite side if desired to further improve the resistance to impact in the direction of Z-axis.

Described next pertains to outer protective beams 28A and 28B. Outer protective beams 28A and 28B are provided for the purpose of suppressing vibrations in the vertical direction of first frame 24.

Outer protective beam 28A extends from fifth side 225 of second frame 22 toward first frame 24, and it faces vibration axis S2 of second vibration elements 23A and 23B with a predetermined space. Outer protective beam 28B extends from seventh side 227 of second frame 22 toward first frame 24, and it also faces vibration axis S2 with the predetermined space. In other words, outer protective beams 28A and 28B are formed toward first frame 24 from the second confronting portions of the respective insides of second frame 22, so that they are in parallel to vibration axis S2 with the predetermined space. Outer protective beams 28A and 28B, first frame 24 and second frame 22 are formed flush with one another when viewed from the opposite side of reflection surface of mirror 26, as shown in FIG. 2.

Second frame 22 is elastically deformable as similar to first frame 24. Since outer protective beams 28A and 28B are formed long in their lengths, they are flexible and superior in the cushioning property. They therefore provide optical reflection element 21 with a high resistance to impact against second vibration elements 23A and 23B in the direction of Z-axis. In other words, parts of second vibration elements 23A and 23B come to abut against corresponding portions of outer protective beams 28A and 28B even if first frame 24 shifts in the direction of Z-axis due to extraneous vibrations and the like. This suppresses an excessive displacement of first frame 24, and it hence improves the resistance to impact in the direction of Z-axis.

It is desirable that a space is provided between a tip of outer protective beam 28A and first frame 24 as well as between a tip of outer protective beam 28B and first frame 24. In this structure, first frame 24 comes to abut any of the tips of outer protective beams 28A and 28B when first frame 24 shifts along the vibration axis S2 (i.e., the X-axis) due to extraneous vibrations and the like. It can hence suppress an excessive displacement of first frame 24, thereby improving the resistance to impact in both of the horizontal direction (at least the direction of X-axis) and the direction of Z-axis.

In addition, outer protective beams 28A and 28B formed unitary with second frame 22 can provide for advantage of downsizing and extension to higher frequencies. In other words, this structure eliminates the need to provide an additional cover, therefore the thickness and overall size of optical reflection element 21 can be reduced. The structure also makes it unnecessary to have asperities formed on first frame 24 and second frame 22 in order to add an extra mass of second vibration elements 23A and 23B, and it therefore helps increase a frequency of driving especially about the vibration axis S2.

Outer protective beams 28A and 28B are formed on fifth side 225 and seventh side 227, as the shorter sides of second frame 22, in parallel with and in a manner to face vibration axis S2, respectively. On the other hand, inner protective beam 27 is formed between first side 241 and third side 243, as the shorter sides of first frame 24, in parallel with and in a manner to face vibration axis S1. By virtue of this structure, mirror 26 can vibrate in a repeatable turning motion of large amplitude about both vibration axis S2 in the direction of X-axis and vibration axis S1 in the direction of Y-axis. Inner protective beam 27 is in position close to first vibration elements 25A and 25B, and outer protective beams 28A and 28B are in positions close to second vibration elements 23A and 23B in the manner as discussed above. Therefore, the resistance to impact can further be improved in addition to reducing the size and weight of optical reflection element 21.

Furthermore, the center of first frame 24 can be aligned in position above vibration axis S1 because of outer protective beams 28A and 28B. It is hence possible to vibrate first frame 24 and mirror 26 in the repeatable turning motion about a fixed point in the center of gravity located at substantially the center of mirror 26, and to project images with high accuracy.

In the structure shown in FIG. 1 and FIG. 2, outer protective beams 28A and 28B extending from the shorter sides of second frame 22 are provided, but not in the area above mirror 26. Besides this structure, it is also possible to separate inner protective beam 27 at a position that faces mirror 26, and connect outer protective beams 28A and 28B at the same position facing mirror 26, to form them into a single piece of outer protective beam. In this case, first frame 24 needs to be so formed that an underside surface thereof lies at least above an upper surface of the single outer protective beam when it is positioned with the reflection surface of mirror 26 up, as shown in FIG. 1. The productivity can be improved by making first vibration elements 25A and 25B flush with first frame 24 when forming the protective beams by etching an inner layer as will be described later.

In the structure shown in FIG. 2, outer protective beams 28A and 28B are disposed only on one side of optical reflection element 21. It is desirable, however, that outer protective beams 28A and 28B are provided on both sides because second vibration elements 23A and 23B have a lower resonant frequency and displacement of larger magnitude attributed to their structure, as compared to first vibration elements 25A and 25B. As an alternative, either one of them may be substituted by a cover of separate piece.

Figure 3:
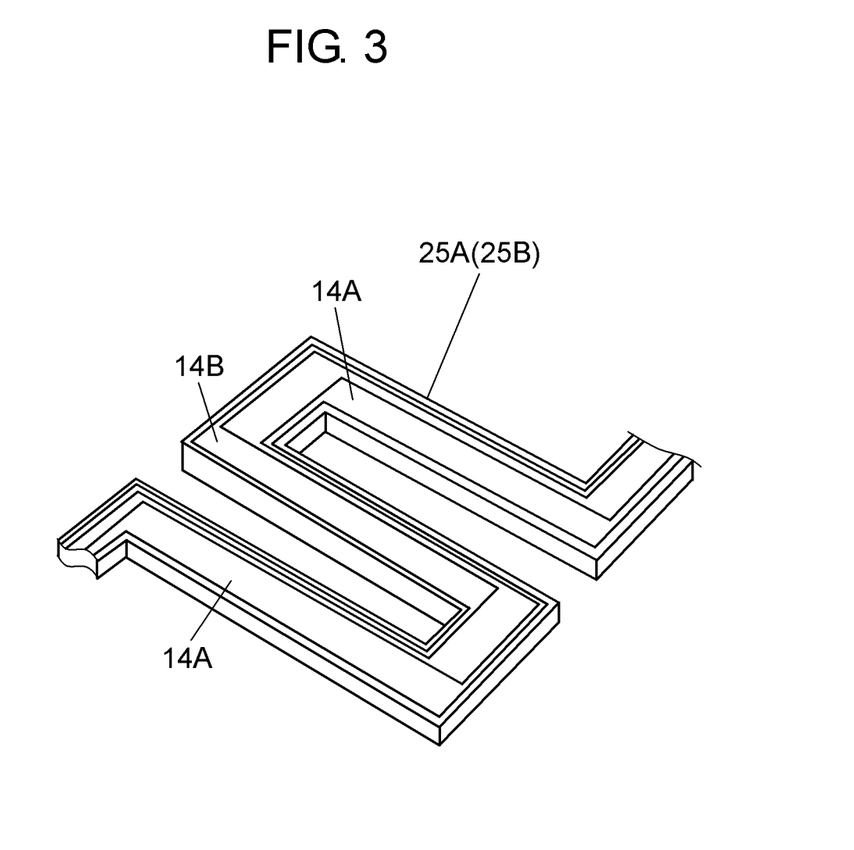
FIG. 3 is a perspective view of a first vibration element of the optical reflection element shown in FIG. 1.

Description is provided briefly of how optical reflection element 21 operates by referring to FIG. 3. There is one pair of independent vibration electrodes 14A and 14B formed at least on first vibration elements 25A and 25B. Among any adjacent two of vibration segments, as straight portions that compose first vibration element 25A, one carries vibration electrode 14A formed wider than vibration electrode 14B, and the other carries vibration electrode 14B formed wider than vibration electrode 14A. First vibration element 25B also has vibration electrodes 14A and 14B formed with the same configuration. Voltage of an oscillating frequency natural to first vibration elements 25A and 25B is applied to vibration electrodes 14A and 14B formed in this configuration. In this instance, first vibration elements 25A and 25B flexuously vibrate in the directions opposite to each other when ac voltages of opposite phases are applied to the vibration electrodes of first vibration elements 25A and 25B respectively. As a result, individual displacements corresponding to a number of the vibration segments are added up about the vibration axis S1. Because of this vibrating amplitude of first vibration elements 25A and 25B, side edges of mirror 26 vibrate in the direction of its thickness, or the Z-axis, which is orthogonal to both of the X-axis and the Y-axis. Mirror 26 hence vibrates in the repeatable turning motion of large amplitude about the vibration axis S1.

Second vibration elements 23A and 23B are also provided with vibration electrodes disposed on them in the similar fashion as first vibration elements 25A and 25B. Displacements corresponding to a number of the vibration segments are therefore added up about the vibration axis S2 in the direction of X-axis. This makes first frame 24 therein having mirror 26 vibrate in a repeatable turning motion of large amplitude about the vibration axis S2. A basic structure of optical reflection elements of this type is disclosed, for instance, in International Publication No. 2010/122751.

Next, a manufacturing method of optical reflection element 21 is described hereinafter with reference to FIG. 4A through FIG. 4F. FIG. 4A to FIG. 4F are sectional views of the optical reflection element shown in FIG. 1, and illustrating the manufacturing method of the same.

Figure 4A:
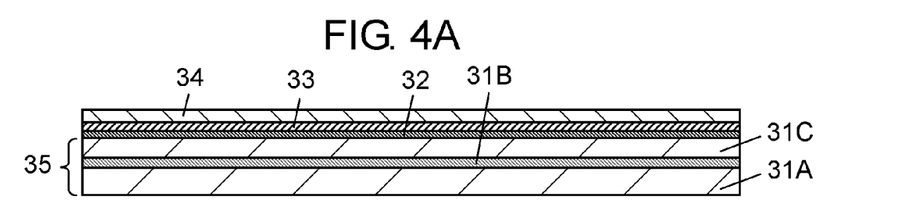
FIG. 4A is a sectional view illustrating a process of manufacturing the optical reflection element shown in FIG. 1.

As shown in FIG. 4A, laminated substrate 35 composed of bottom layer 31A, inner layer 31B and top layer 31C is firstly prepared. Lower metal layer 32 is then formed on top layer 31C. Next, piezoelectric film 33 is formed on lower metal layer 32 from a piezoelectric material. Upper metal layer 34 is further formed on piezoelectric film 33. Lower metal layer 32, piezoelectric film 33 and upper metal layer 34 can be formed and laminated in this sequential order with sputtering or the like method.

Figure 4B:
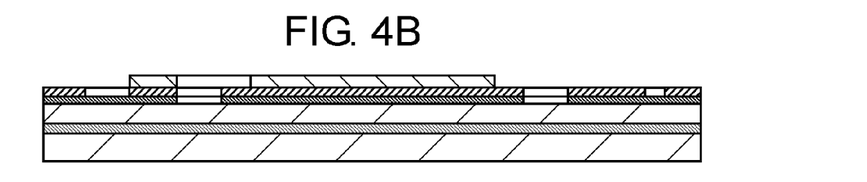
FIG. 4B is a sectional view illustrating a subsequent step of FIG. 4A in the process of manufacturing the optical reflection element shown in FIG. 1.

Next, portions of lower metal layer 32, piezoelectric film 33 and upper metal layer 34 are removed as shown in FIG. 4B with ICP dry etching method by using an elastic resin layer (not shown) as an etching mask.

Figure 4C:
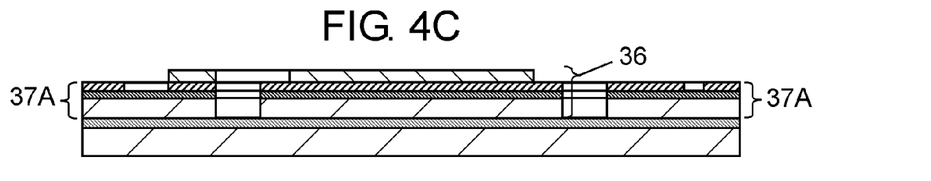
FIG. 4C is a sectional view illustrating another step following FIG. 4B in the process of manufacturing the optical reflection element shown in FIG. 1.

Next, etching treatment is performed to a portion of top layer 31C which is exposed after these portions of lower metal layer 32, piezoelectric film 33 and upper metal layer 34 are removed, as shown in FIG. 4C. This process forms vibration element 36 that becomes mirror 26, upper frame portion 37A that becomes first frame 24, and first vibration elements 25A and 25B hidden behind the sectioned view.

Figure 4D:
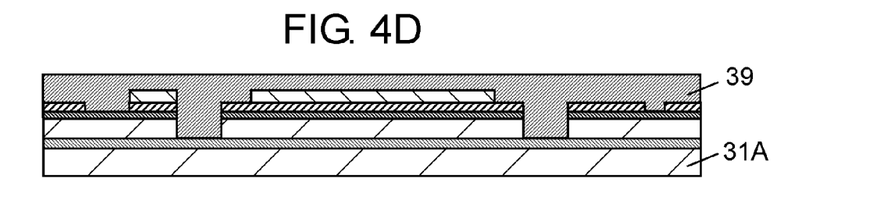
FIG. 4D is a sectional view illustrating another step following FIG. 4C in the process of manufacturing the optical reflection element shown in FIG. 1.
Figure 4E:
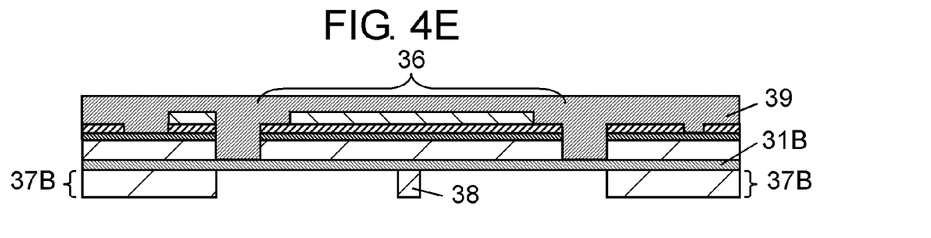
FIG. 4E is a sectional view illustrating still another step following FIG. 4D in the process of manufacturing the optical reflection element shown in FIG. 1.

In the next step, elastic resin layer 39 consisting of a photosensitive resin is formed over vibration element 36, upper frame portion 37A and the like as shown in FIG. 4D, and bottom layer 31A is etched thereafter as shown in FIG. 4E. This process forms beam 38 that becomes inner protective beam 27, and lower frame portion 37B that becomes first frame 24.

Figure 4F:
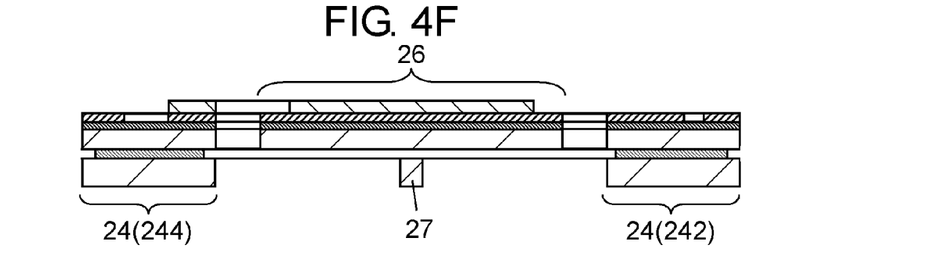
FIG. 4F is a sectional view illustrating yet another step following FIG. 4E in the process of manufacturing the optical reflection element shown in FIG. 1.

Subsequently, inner layer 31B is subjected to an etching process to remove a portion of inner layer 31B under vibration element 36, and form mirror 26 and inner protective beam 27, as shown in FIG. 4F. Finally, elastic resin layer 39 is removed to complete first frame 24 and individual components included in it. Elastic resin layer 39 functions as a reinforcing member while etching bottom layer 31A and inner layer 31B. It is also feasible to form second vibration elements 23A and 23B and outer protective beams 28A and 28B at the same time with these processes.

Materials that can be used here for bottom layer 31A and top layer 31C include silicon, glass, quartz, metals such as stainless steel, and the like. The material used in this embodiment is silicon, which is suitable for fine patterning to process it into a desired shape by using a thin-film forming technique such as wet etching and dry etching. It is desirable that it has an insulation layer of silicon dioxide formed as an outer layer. It is also desirable that platinum or the like material is used for lower metal layer 32 from the viewpoint of improving crystalline orientation of piezoelectric film 33, and that a material having a high piezoelectric characteristic such as lead-zirconate titanate can be a good example for piezoelectric film 33. Upper metal layer 34 can be formed of gold or the like material.

According to this manufacturing method, only what is necessary is to change a part of the traditional manufacturing process to adapt it for easily producing optical reflection element 21 of the unitary structure provided with impact suppression measures in the direction of Z-axis. It is also possible to ensure alignment of the space between inner protective beam 27 and first vibration elements 25A and 25B, the space between outer protective beam 28A and second vibration element 23A, as well as the space between outer protective beam 28B and second vibration element 23B with accuracy in a level of sub-microns. This accuracy can remarkably improve the resistance to impact in the direction of Z-axis when compared with the conventional structure. It also helps facilitate mass production with excellent advantage in cost since the unitary structure of optical reflection element 21 can be achieved without increasing the number of components.

Figure 5:
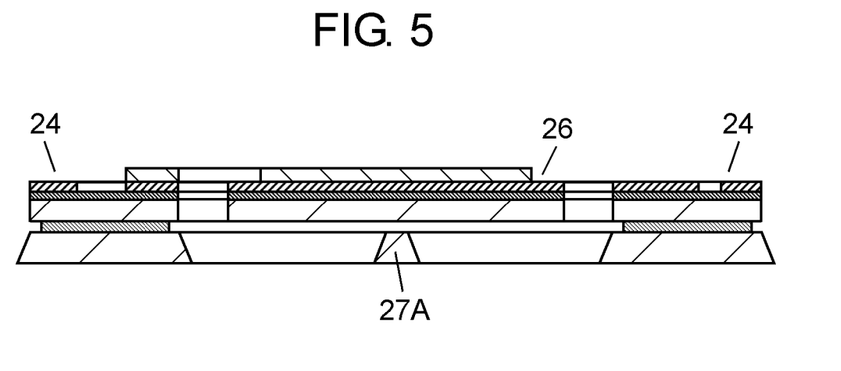
FIG. 5 is a sectional view of another optical reflection element according to the embodiment of the present invention.
Figure 6:
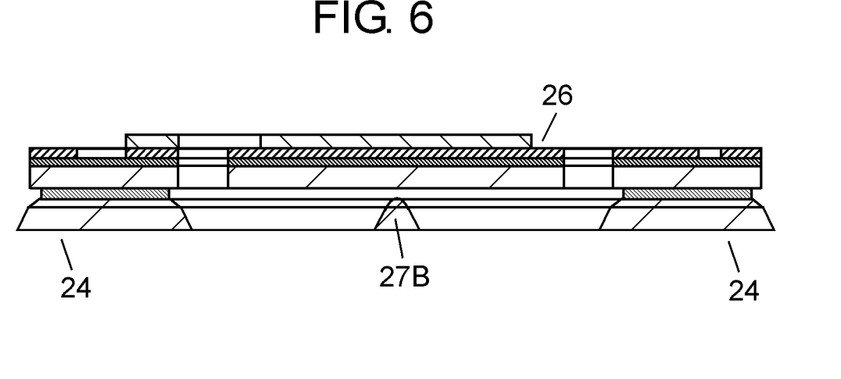
FIG. 6 is a sectional view of still another optical reflection element according to the embodiment of the present invention.

Furthermore, the shape of inner protective beams 27 may be altered to any of shapes shown in FIG. 5 and FIG. 6. FIGS. 5 and 6 are sectional views of other optical reflection elements according to this embodiment.

In the structure shown in FIG. 5, inner protective beam 27A has substantially a trapezoidal shape in cross-section in the direction of Z-axis. In this shape, the lower surface is wider than the opposed side, as the upper surface next to mirror 26. It thus improves the physical strength as an impact-suppressing member. In another structure shown in FIG. 6, inner protective beam 27B is provided with a raised portion on the side that faces mirror 26, and the lower surface opposite to that side is formed wider than the upper surface. This shape can provide for an excellent cushioning property, and make full use of outstanding effect as an impact-suppressing member capable of absorbing vibrations of mirror 26 efficiently. In addition, this shape eases the manufacturing process.

Method available to form the inner protective beams and the outer protective beams is not limited only to that discussed above. For example, any of inner protective beams and outer protective beams can be fixed to an inner frame (i.e., one corresponding to first frame 24) and an outer frame (one corresponding to second frame 22) of a conventional optical reflection element with adhesive or the like. However, durability of the inner protective beams and the outer protective beams can be improved when they are formed unitary with first frame 24 and second frame 22, respectively, as discussed above, thereby resulting in an improvement of the reliability of the optical reflection element.

Figure 7:
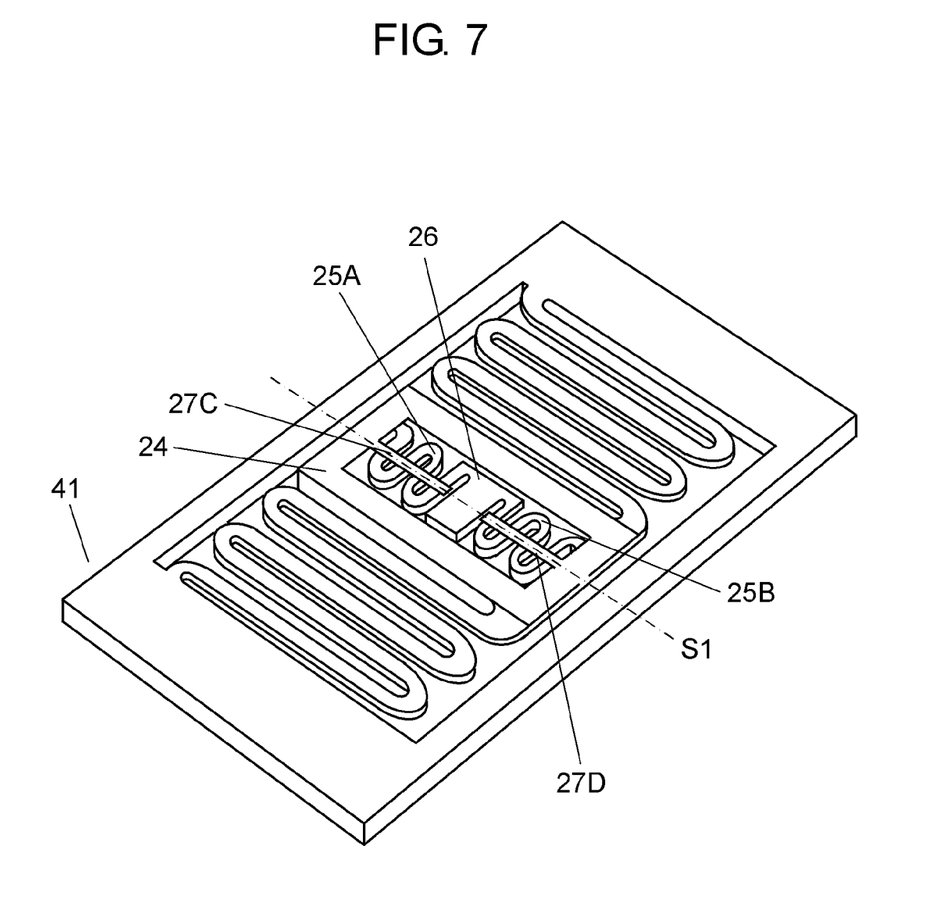
FIG. 7 is a top perspective view of yet another optical reflection element according to the embodiment of the present invention.

Description is provided next of a different optical reflection element according to this exemplary embodiment by referring to FIG. 7, which is a top perspective view of the optical reflection element in this embodiment of the invention.

Optical reflection element 21 shown in FIG. 1 and FIG. 2 has inner protective beam 27 and outer protective beams 28A and 28B disposed on the underside opposite to the reflection surface of mirror 26. On the other hand, optical reflection element 41 shown in FIG. 7 has inner protective beams 27C and 27D disposed on an upper surface side where a reflection surface of mirror 26 is provided. The structure other than this aspect is identical to optical reflection element 21.

Inner protective beams 27C and 27D are formed in directions toward mirror 26 from confronting portions of the respective insides of first frame 24, and that they are in parallel with vibration axis S1 of first vibration elements 25A and 25B, and faces first vibration elements 25A and 25B with a predetermined space. In addition, inner protective beams 27C and 27D are so formed as to stay out of an area above mirror 26 to leave opened above mirror 26. Because of this structure, inner protective beams 27C and 27D do not interfere with incoming light to the reflection surface of mirror 26 as well as outgoing light from the reflection surface. This structure can also suppress an excessive displacement of first vibration elements 25A and 25B in the direction of Z-axis.

Inner protective beam 27, when disposed on the backside of the reflection surface of mirror 26, does not interfere with the reflection surface as discussed with reference to FIG. 2. Therefore, inner protective beam 27 needs not be separated like inner protective beams 27C and 27D. It is hardly likely that external impacts cause mirror 26 to displace in the horizontal direction like the case of first frame 24, since the resonant frequency of first vibration elements 25A and 25B is higher by one digit or more than the resonant frequency of second vibration elements 23A and 23B. This is another reason that does not require separation in the manner as outer protective beams 28A and 28B.

In addition to the structure of FIG. 7, it is also appropriate to provide outer protective beams 28A and 28B in the same manner as optical reflection element 21. Each of a pair of outer protective beams 28A and 28B, and any of inner protective beam 27 and a pair of inner protective beams 27C and 27D functions individually. They can hence function effectively even when only either one is provided, or they can be used in any combination.

The shapes of first frame 24 and second frame 22 need not be limited to quadrilaterals, but they can be of any other shapes such as squares, circles and ovals.

Furthermore, the protective beam of this embodiment can be applied to any optical reflection element of a structure that has one-dimensional vibration axis, besides the structure having vibration axes S1 and S2 of two dimensions shown in FIG. 1 and FIG. 7. In other words, the protective beam can be applied to an optical reflection element having first frame 24, and a combination of first vibration elements 25A and 25B and mirror 26 formed inside first frame 24.

INDUSTRIAL APPLICABILITY

Optical reflection elements of the present invention are useful for head-up displays and the like apparatuses for vehicle mounting since they are outstanding in the resistance to impacts and mechanical reliability. The optical reflection elements are also useful for small image projection devices such as small displays and head-mounted displays, laser printers and electronic photographic apparatuses for which high reliability is required.

REFERENCE MARKS IN THE DRAWINGS 21, 41 Optical reflection element
22 Second frame
23A, 23B Second vibration element
24 First frame
25A, 25B First vibration element
26 Mirror
27, 27A, 27B, 27C, 27D Inner protective beam
28A, 28B Outer protective beam
14A, 14B Vibration electrode
S1, S2 Vibration axis
31A Bottom layer
31B Inner layer
31C Top layer
32 Lower metal layer
33 Piezoelectric film
34 Upper metal layer
35 Laminated substrate
36 Vibration element
37A Upper frame portion
37B Lower frame portion
38 Beam
39 Elastic resin layer
241 First side
242 Second side
243 Third side
244 Fourth side
225 Fifth side
226 Sixth side
227 Seventh side
228 Eighth side

The invention claimed is:

1. An optical reflection element comprising:
a frame;
a pair of meandering-shaped vibration elements having respective outer ends supported by confronting portions of an inside of the frame;
a mirror having a reflection surface and supported by respective inner ends of the vibration elements; and
a pair of protective beams extending from each of the confronting portions of an inside of the frame toward the mirror with a predetermined space from the vibration elements and in parallel with a vibration axis of the vibration elements,
wherein the pair of protective beams are formed opposite to the reflection surface of the mirror, and joined to each other at a position confronting the mirror.

2. An optical reflection element comprising:
a first frame;
a pair of meandering-shaped first vibration elements having respective outer ends supported by first confronting portions of an inside of the first frame;
a mirror having a reflection surface and supported by respective inner ends of the first vibration elements;
a second frame having the first frame disposed therein;
a pair of meandering-shaped second vibration elements having respective outer ends supported by second confronting portions of an inside of the second frame, inner ends supporting the first frame, and a vibration axis orthogonal to a vibration axis of the first vibration elements; and
a pair of outer protective beams extending from each of the second confronting portions of the inside of the second frame toward the first frame with a predetermined space from the second vibration elements and in parallel with the vibration axis of the second vibration elements,
wherein the pair of outer protective beams are formed opposite to the reflection surface of the mirror.

3. The optical reflection element of claim 2, wherein a space is provided between tips of the outer protective beams and the first frame.

4. The optical reflection element of claim 2 further comprising a pair of inner protective beams formed in directions toward the mirror from the first confronting portions of the inside of the first frame with a predetermined space from the first vibration elements and in parallel with the vibration axis of the first vibration elements.

5. The optical reflection element of claim 4, wherein the pair of inner protective beams are formed opposite to the reflection surface of the mirror, and joined to each other at a position confronting the mirror.

6. An optical reflection element comprising:
a frame;
a mirror disposed within the frame, the mirror having a reflection surface;
a pair of meandering-shaped vibration elements having respective outer ends connected to opposite interior portions of the frame and respective inner ends connected to exterior portions of the mirror;
a pair of protective beams extending from the opposite interior portions of the frame toward the mirror, wherein the pair of protective beams are disposed in parallel with a vibration axis of the vibration elements, offset from the vibration elements by a predetermined space in a direction orthogonal to the vibration axis, and are formed opposite to the reflection surface of the mirror.

7. The optical reflection element of claim 6, further comprising
an outer frame having the frame disposed therein;
another pair of meandering-shaped vibration elements having respective outer ends connected to opposite interior portions of the outer frame and respective inner ends connected to an exterior portion of the first frame, wherein a vibration axis of the another pair of meandering-shaped vibration elements is orthogonal to the vibration axis of the vibration elements; and
a pair of outer protective beams extending from the interior portions of the second frame toward the frame, wherein the pair of outer protective beams are disposed in parallel with a vibration axis of another pair of meandering-shaped vibration elements, offset from the another pair of vibration elements by a predetermined space in a direction orthogonal to the vibration axes of the vibration elements and the another vibration elements, and are formed opposite to the reflection surface of the mirror.

* * * * *